(12) United States Patent
Lange et al.

(10) Patent No.: US 7,863,098 B2
(45) Date of Patent: Jan. 4, 2011

(54) FLIP CHIP PACKAGE WITH ADVANCED ELECTRICAL AND THERMAL PROPERTIES FOR HIGH CURRENT DESIGNS

(75) Inventors: Bernhard P Lange, Freising (DE); Anthony L Coyle, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/330,728

(22) Filed: Dec. 9, 2008

(65) Prior Publication Data

US 2009/0087948 A1    Apr. 2, 2009

Related U.S. Application Data

(62) Division of application No. 11/358,668, filed on Feb. 21, 2006, now Pat. No. 7,476,976.

(60) Provisional application No. 60/656,506, filed on Feb. 23, 2005.

(51) Int. Cl.
*H01L 21/58* (2006.01)
(52) U.S. Cl. .................. 438/108; 257/E21.511
(58) Field of Classification Search ......... 438/106–108, 438/110–114, 125–127; 257/E21.499, E21.502–E21.519
See application file for complete search history.

(56) References Cited

U.S. PATENT DOCUMENTS

| | | | |
|---|---|---|---|
| 5,594,234 A | 1/1997 | Carter, Jr. et al. | |
| 6,072,230 A | 6/2000 | Carter, Jr. et al. | |
| 6,075,289 A | 6/2000 | Distefano | |
| 6,597,065 B1 * | 7/2003 | Efland | 257/712 |
| 6,611,055 B1 * | 8/2003 | Hashemi | 257/706 |
| 6,683,380 B2 | 1/2004 | Efland et al. | |
| 6,777,788 B1 | 8/2004 | Wan et al. | |
| 6,784,539 B2 | 8/2004 | Efland | |
| 6,967,125 B2 | 11/2005 | Fee et al. | |
| 2002/0011674 A1 | 1/2002 | Efland et al. | |

OTHER PUBLICATIONS

"DirectFET Power MOSFET Packaging Technology Enables Discrete Multiphase Converter Design Capable of up to 2MHz/phase Operation", Ralph Montiero, Carl Blake and Jason Chiu, International Rectifier as presented at PCIM China, Mar. 2003, 4 pgs.

* cited by examiner

*Primary Examiner*—Marcos D. Pizarro
(74) *Attorney, Agent, or Firm*—Yingsheng Tung; Wade J. Brady, III; Frederick J. Telecky, Jr.

(57) ABSTRACT

A QFN package and method of making same is provided comprising a substrate having a metal line extending from a connection element on a perimeter region of the substrate to a high current contact pad on interior region of the substrate. A semiconductor chip having an active surface generally faces the interior region of the substrate, wherein a heat-dissipating patterned metal distribution layer is formed over the active surface and electrically connected to an active component thereon. A solder strip electrically and thermally connects the high current contact pad and the metal distribution layer, and a mold compound generally encapsulates the semiconductor chip. The solder strip is generally uniform in depth and surface area, wherein low electrical resistance and inductance is provided between the high current contact pad and the metal distribution layer. An integrated heat sink may be further formed or placed on a passive surface of the chip.

6 Claims, 6 Drawing Sheets

FLIP CHIP PACKAGE WITH ADVANCED ELECTRICAL AND THERMAL PROPERTIES FOR HIGH CURRENT DESIGNS

RELATED APPLICATIONS

This application is a division of application Ser. No. 11/358,668, filed Feb. 21, 2006, now U.S. Pat. No. 7,476,976, and claims the priority of U.S. provisional application Ser. No. 60/656,506, filed Feb. 23, 2005, the contents of which are herein incorporated by referenced in its entirety.

FIELD OF THE INVENTION

The present invention relates generally to semiconductor devices and processes, and more particularly to a quad flat pack no-lead (QFN) integrated circuit package and method for fabricating the same.

BACKGROUND OF THE INVENTION

An ongoing challenge in integrated circuit (IC) technology comprises the removal of thermal heat generated by active components of the integrated circuit, especially when the integrated circuit has high current requirements, such as in a high-current quad flat pack no-lead (QFN) integrated circuit package. Pressure in the industry continues to demand increased densities of device integration, as well as diminished component feature sizes, therein increasing densities of power and thermal energy generation. However, in order to maintain the active components at their optimum (low) operating temperatures and speed, this heat must be continuously dissipated and removed to outside heat sinks. Unfortunately, this effort becomes increasingly more difficult as the energy density becomes progressively greater.

One effective approach to remove heat in conventional packages focuses on thermal transport through the thickness of the semiconductor chip from the active surface to the passive surface. FIG. 1 illustrates a conventional semiconductor package 10, comprising a semiconductor chip 12 having an active surface 14 and a passive surface 16. Active components (not shown) positioned on the active surface 14 of the semiconductor chip 12 are typically bonded to individual leads 18 of a metallic leadframe 20 via bond wires 22, and the semiconductor chip is further encapsulated by a plastic encapsulation device 24 to protect the chip and associated wire bonds.

The passive surface 16 of the semiconductor chip 12 is attached to a chip mount pad 26 of the metallic leadframe 20, wherein the thermal energy from the integrated circuit can flow into the chip mount pad of the metallic leadframe. When properly formed, this leadframe 20 can act as a heat spreader to an outside heat sink (not shown, but typically provided on a printed circuit board, to which the semiconductor package is mounted). In many semiconductor package designs, this implies a portion 28 of the leadframe 20 protruding from the plastic encapsulation device 24 such that it can be directly attached to the outside heat sink. Examples are described in U.S. Pat. No. 5,594,234, issued on Jan. 14, 1997 (Carter et al., "Downset Exposed Die Mount Pad Leadframe and Package") and U.S. Pat. No. 6,072,230, issued on Jun. 6, 2000 (Carter et al., "Bending and Forming Method of Fabricating Exposed Leadframes for Semiconductor Devices").

From a standpoint of thermal efficiency, these approaches have several shortcomings. For example, the heat generated by active components must traverse the macroscopic thickness of the semiconductor chip 12 in order to exit from the chip through the leadframe 20. The heat further faces the thermal barrier of the die attach material that couples the chip 12 to the mount pad 26 (typically a polymer) before it can enter the leadframe 20. Further, a technical solution is missing to remove the heat generated by active components directly from the IC into a metallic heat conductor and heat spreader positioned in microscopic proximity to the active component on the active surface 16. In the typical package 10, the heat is first spread through the macroscopic thickness of the molding material 24 (typically an epoxy filled with inorganic particles, a mediocre thermal conductor) and only then is the heat spread into a metallic heat spreader (not shown), usually positioned on a surface 30 of the molded package 10.

QFN packages are similar to the conventional package 10, however, the leads 18 of the conventional package are integrated into the package, as illustrated in FIG. 2. The QFN package 40 again comprises a chip 42 having an active surface 44 and a passive surface 46. Active components (not shown) positioned on the active surface 44 of the semiconductor chip 42 are conventionally bonded to integrated leads 48 of a metallic leadframe 50 via bond wires 52, and the semiconductor chip is again encapsulated by an encapsulation device 54 to protect the chip and associated wire bonds. Similar to the conventional package 10 of FIG. 1, the conventional QFN package 40 of FIG. 2 also suffers from a mediocre transfer of heat from the active surface 44 of the chip 42 during operation, since the a heat sink cannot be placed proximal to the active surface. Heat is conventionally transferred through the thickness of the chip 42 and then through the passive surface to a customer-supplied circuit board or other device, which may or may not further comprise an external heat sink.

The thermal situation is likewise difficult in a conventional ball-grid (or land-grid) array package. A typical BGA package 60 is illustrated in FIG. 3, wherein the BGA package generally comprises an IC chip 62 mounted to a multi-layer substrate 64 (e.g., a circuit board), wherein the substrate acts as a heat spreader 66. The IC chip 62 may be further enclosed by a metal cap 68 or a mold compound (not shown), thus mechanically protecting the IC chip from external forces. The IC chip 62 is generally mounted on the substrate 64 via a plurality of solder balls 70, wherein the solder balls electrically connect the small bond pads 72 of the IC chip to the bond pads 74 on the substrate, while also acting as a thermal path to dissipate thermal energy away from the IC chip. The thermal path, however, is limited through the solder balls 70, since the size of the solder balls is small relative to the distance required for thermal energy dissipation. Furthermore, the size of the solder balls also limits the current that can be passed between the IC chip and the substrate. A QFN package utilizing such a conventional BGA design, therefore, is greatly limited in the amount of current that can pass through the solder balls, as well as in terms of heat transfer through the solder ball connection to the circuit board.

Therefore, a need currently exists for a thermally improved, high power high electrical current QFN package structure. Further, a reliable and cost-effective method for producing the QFN package is desirable, wherein the resulting package should not only meet high thermal and electrical performance requirements, but the manufacture of same should also achieve improvements towards the goals of enhanced process yields and device reliability.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward an improved quad flat pack no-lead (QFN) integrated circuit package and method of forming the same, wherein the QFN package comprises a semiconductor chip having an active surface. A plurality of active components or circuits are generally disposed on or within the active surface, wherein one or more of the active components comprises a high current component; that is, the high current component may require a large current draw to operate when compared to other components or circuits. Such a large current draw has a tendency to create heat, which is disadvantageous to the operation of the QFN package if it is not abated. Accordingly, a patterned metal distribution layer is formed or otherwise disposed over the active surface and electrically and thermally connected to the active component, wherein the patterned metal distribution layer is operable to efficiently dissipate heat associated with the active component.

According to the present invention, the active surface of the chip generally faces the interior region of a substrate, wherein the substrate may comprise a QFN lead frame or other type of substrate such as a circuit board. The substrate comprises one or more metal lines extending from a perimeter region of the substrate to an interior region of the substrate, wherein each metal line comprises one or more connection elements disposed in the perimeter region and a high current contact pad disposed in the interior region of the substrate. The high current contact pad has a surface area associated therewith, wherein the surface area of the high current contact pad is operable to carry the large current draw discussed above.

In accordance with another aspect of the invention, a solder connection is disposed between the high current contact pad and the patterned metal distribution layer, wherein the solder connection provides a low thermal and electrical resistance path between the high current contact pad and the patterned metal distribution layer. The solder connection, for example, may comprise a printed or applied solder strip or paste that is applied or formed on one of the high current contact pad and patterned metal distribution layer. An electrically insulative mold compound further generally encapsulates the semiconductor chip, wherein the one or more connection elements provide an external electrical connection to the active component(s) of the semiconductor chip that is encapsulated within the mold compound.

According to another aspect of the invention, an integrated heat sink is thermally coupled to a passive surface of the semiconductor chip, wherein the passive surface is disposed generally opposite the active surface of the semiconductor chip. The integrated heat sink may be thermally coupled to the passive surface of the semiconductor chip via a stress-absorbing layer disposed between the passive surface of the semiconductor chip and the integrated heat sink, wherein the stress-absorbing layer is operable to reduce the effects of differences in thermal expansion between the chip and the heat sink. The integrated heat sink may be generally encapsulated with the semiconductor chip by the electrically insulative mold compound, or, alternatively, a periphery of the integrated heat sink is generally encapsulated by the electrically insulative mold compound, while an external surface of the integrated heat sink is not encapsulated and remains exposed to the external environment. An external heat sink may be further thermally coupled to the external surface of the integrated heat sink.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
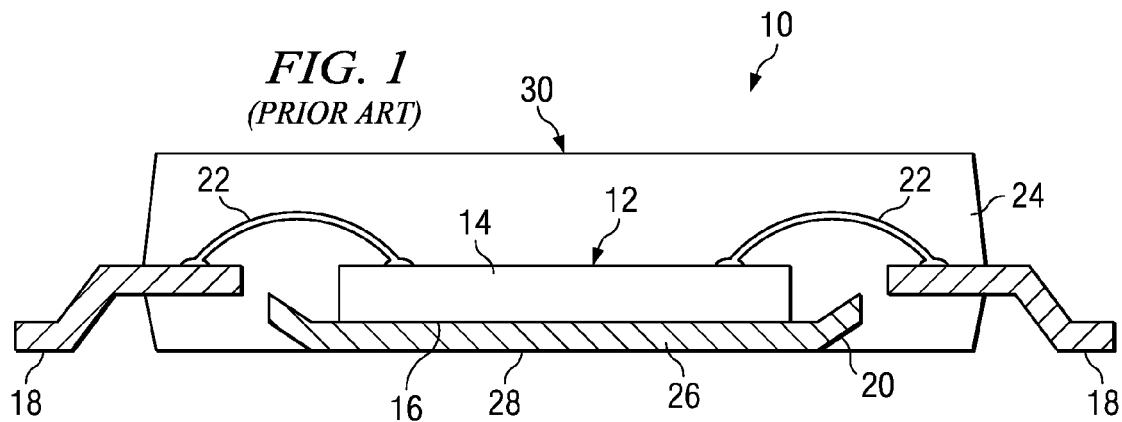
FIG. 1 is a cross-sectional view of conventional semiconductor device formed over a lead frame.
Figure 2:
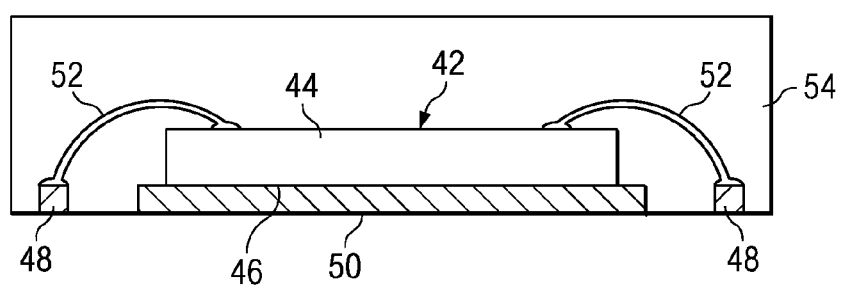
FIG. 2 is a cross-sectional view of conventional wire-bonded QFN package.
Figure 3:
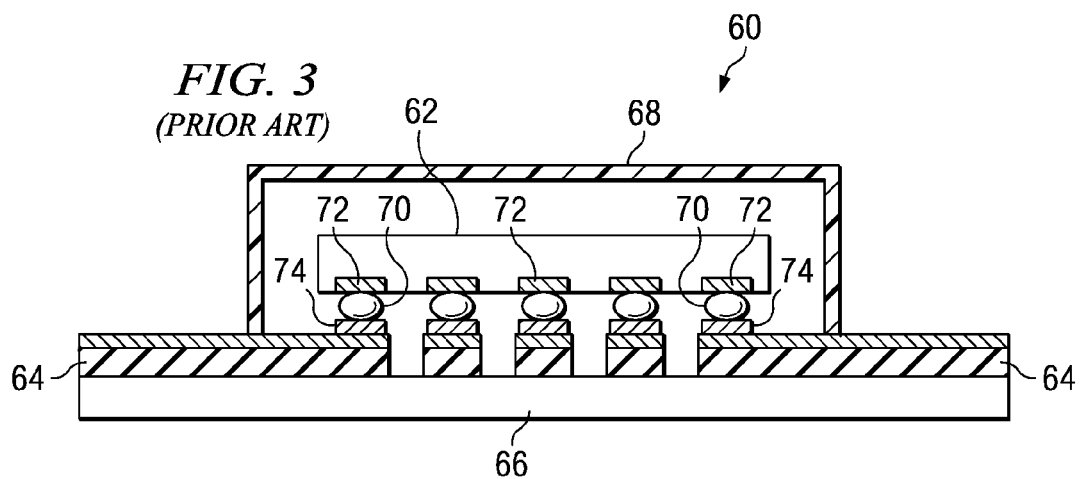
FIG. 3 is a cross-sectional view of conventional BGA device formed over a circuit board.

The present invention is directed towards a quad flat pack no-lead (QFN) integrated circuit package having improved electrical and thermal capabilities, and a method for making the same. More particularly, the QFN package of the present invention provides a low resistance, low inductance interface for a high current capability, while also providing for improved dissipation of heat through the package. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 4:
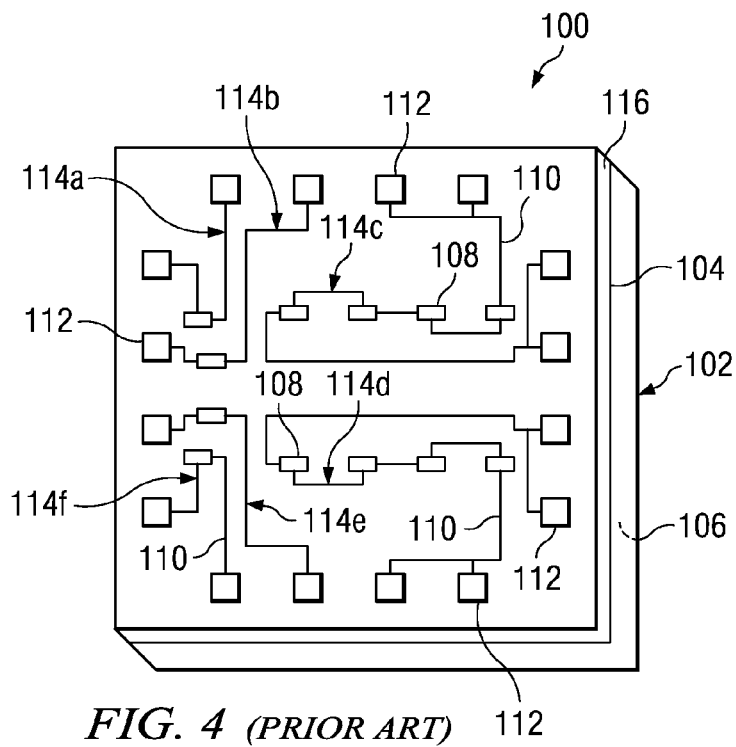
FIG. 4 is a perspective schematic view of a chip for a QFN integrated circuit package.

Referring now to the figures, FIG. 4 illustrates a simplified and schematic plan view of an integrated circuit (IC) chip 100. The IC chip 100 comprises a semiconductor substrate 102, such as a silicon substrate ranging between about 225 and 475 μm in thickness, wherein an active surface 104 and an oppositely disposed passive surface 106 are defined thereon. Embedded in the active surface 104 of the chip 100 are a plurality of active components 108 of the IC. In modern ICs 100, the number of active components 108 is large, often in excess of one million, wherein the active components are miniaturized in lateral and vertical dimensions.

The surface 104 further comprises one or more metallization layers 110 connecting the active components 108 to a plurality of contact pads 112 of the IC. The one or more metallization layers 110, for example, are comprised of pure or alloyed aluminum, ranging between 0.4 and 1.5 μm in thickness. It should be noted that in some ICs 100, there is a hierarchy of six or more metallization layers 110. The one or more metallization layers 110 (also referred to as metal lines) are generally patterned in lines, wherein the metal lines may conduct electrical power between the active components 108 and the contact pads 112. Metal lines 110 that conduct electrical power typically have widths ranging between about 20 μm to 250 μm.

For illustration purposes, the active components 108 illustrated in FIG. 4 are grouped into a small number of separate electrical loops, illustrated as loops 114a-114f, wherein each loop interconnects one or more active components 108 by one or more metal lines 110. Each loop 114 is further electrically connected to least two contact pads 112, wherein the contact pads are suitable for electrical conductors (not shown) to connect the respective contact pads with outside parts, such as external power supplies or other electronics. The number of contact pads 112 per chip 100, for example, may vary from 4 to more than 600, depending on the type of circuitry desired. Furthermore, the active surface 102 of the semiconductor substrate 100 is uniformly covered with a protective overcoat 116, wherein the contact pads 112 are generally exposed as windows in the overcoat around the perimeter of the chip. Typically, the overcoat 116 ranges between 0.8 μm and 1.2 μm thick, and is comprised of an electrically insulative material such as silicon nitride or silicon oxy-nitride, wherein the overcoat also acts as a thermal insulator.

Figure 5:
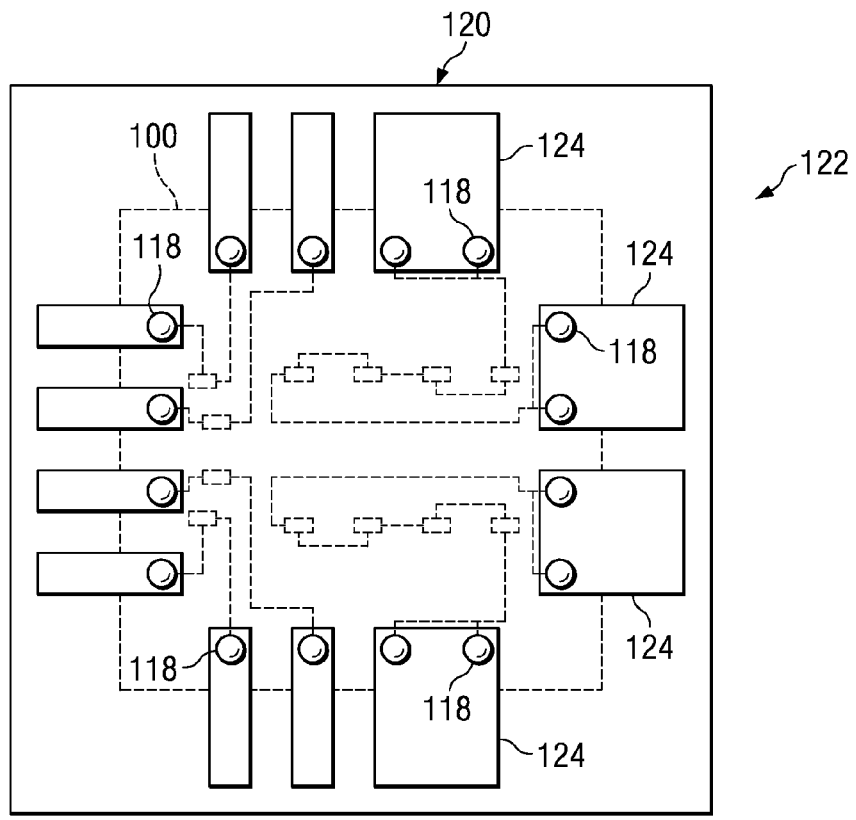
FIG. 5 is a plan view of a QFN integrated circuit package.

In the present example, a plurality of generally spherical or dome-shaped solder balls 118 are provided for electrical interconnection of the IC 100 to a substrate 120 illustrated in FIG. 5, such as a circuit board or leadframe connected to various external electronic components. Other electrical interconnections may comprise bonding wires or ribbons, such as gold wires ranging between about 20 μm to 100 μm in diameter. The plurality of solder balls 118 illustrated in FIG. 5, however, are attached to the contact pads 112 of the IC 100 of FIG. 4, wherein the active surface 104 of the chip faces the substrate 120, and wherein the plurality of solder balls are utilized as flip-chip connections to the circuit board or leadframe of FIG. 5, therein defining an integrated circuit package 122. In FIG. 5, the chip 100 is illustrated in phantom with the passive surface 106 of FIG. 4 of the chip facing the viewer.

A potential of various problems and limitations exist, however, with the IC 100 of FIG. 4 and its interconnection to the substrate of FIG. 5, such as limited thermal effectiveness, and limited high current capabilities. For example, placement of the solder balls 118 far from the heat-generating active components 108 is generally ineffective for IC heat spreading and heat removal. Furthermore, the conventional solder balls 118 provide limited current-carrying and thermal conductance capabilities, due to their inherent size. Also, placing power input/output terminals (illustrated as connected to large contact pads 124 on the substrate 120) around the periphery of the chip 100 typically requires lengthy electrical power lines (e.g., metal lines 110 of FIG. 4) to interconnect active components 108, therein increasing electrical resistances and power requirements, while also further increasing temperatures on the chip associated with the increased resistances. Such problems are intensified in high current QFN packages, since the increasing demands for high current and high heat transfer capabilities have been heretofore difficult to attain while maintaining a small footprint for the QFN package.

Figure 6:
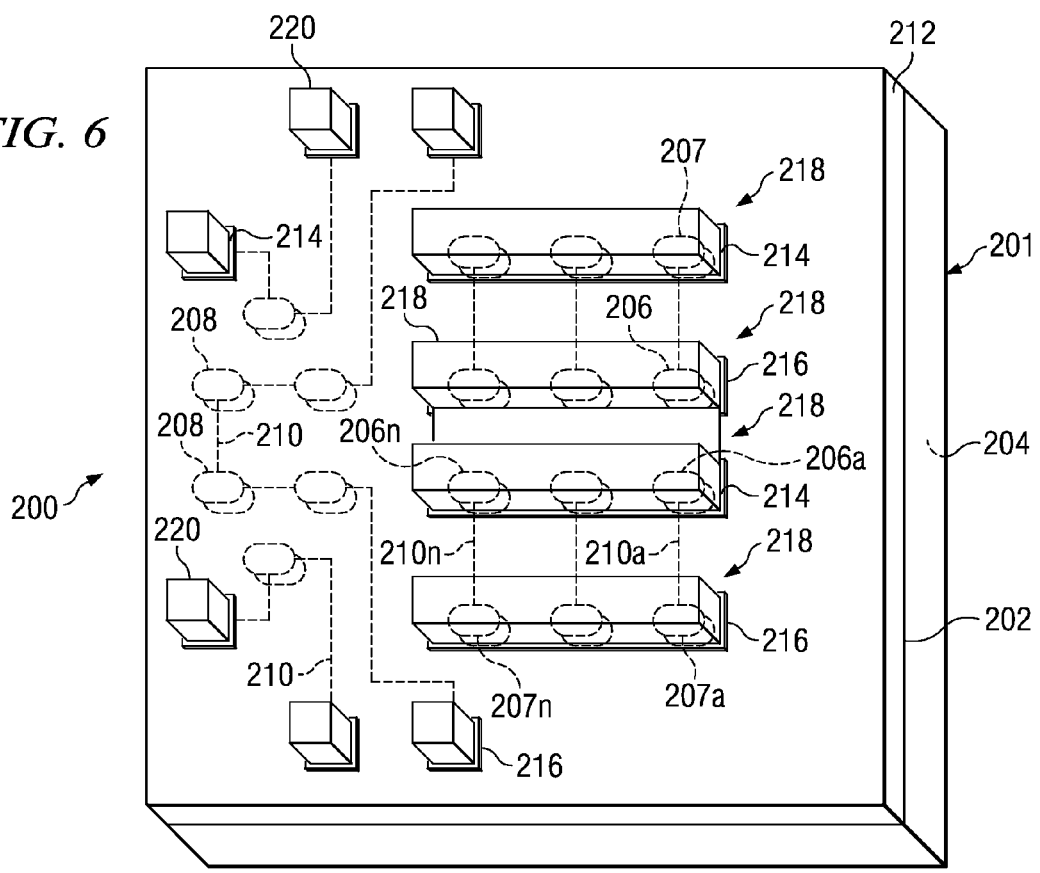
FIG. 6 is a perspective schematic view of a semiconductor chip for a QFN integrated circuit package of the present invention.

Accordingly, several aspects of the present invention will now be described that can remedy the shortcomings of the chip 100 of FIGS. 4 and 5. FIG. 6, for example, illustrates a simplified and schematic perspective view of a semiconductor chip 200 suitable for use in a QFN integrated circuit package according to the invention, with design and fabrication features that will be described hereafter. It should be noted that design of the semiconductor chip 200 and associated QFN package to be discussed hereafter may vary significantly from that shown in FIG. 6, and that various features of the QFN package are simplified for illustrative purposes, and should not be taken in a limiting sense.

The semiconductor chip 200 of FIG. 6, for example, comprises a substrate 201 having an active surface 202 and an oppositely disposed passive surface 204 wherein the substrate is comprised of silicon, silicon germanium, gallium arsenide, or any other semiconductor material used in integrated circuit manufacture. Embedded in or disposed on the active surface 202 of the chip 200 are a plurality of active components 206, 207, 208 of the IC. In the present example, active components 206 and 207 (e.g., power switching circuits) have higher current demands than active components 208 (e.g., signal circuits) have lower current demands.

According to the present invention, the active components 206, 207, 208 are organized according to the power supply they share, to the extent the IC functions permit this. For example, active components 206a through 206n share one power current terminal (for instance, an input terminal), and active components 207a through 207n share the other terminal (for instance, an output terminal). In FIG. 6, the power current flows from component 206a to component 207a, . . . , and from component 206n to component 207n. Interconnecting metal lines 210 further interconnect the active components 206 and 207 on the active surface 202. For example, the interconnection from active component 206a to active component 207a is designated 210a; the interconnection from active component 206n to component 207n is designated 210n.

As illustrated in FIG. 6, the active surface 202 of the semiconductor chip 200, and thus the IC embedded in this surface, is uniformly covered with a protective overcoat 212. The overcoat 212, for example, is between 0.4 and 1.5 μm thick, mechanically strong, electrically insulating, and substantially impenetrable for moisture. Preferred materials include silicon nitride, silicon oxy-nitride, silicon carbon alloys and sandwiched films thereof. In some applications, a polyimide layer can be used. In other applications, the overcoat 212 may be omitted altogether.

The semiconductor chip 200 of the present invention further comprises a patterned metal distribution layer 214 deposited over the active components 206, 207, 208, wherein the metal distribution layer is operable to provide thermal dissipation and power/current distribution for the active components. The metal distribution layer 214, for example, comprises one or more metals, such as copper, that is deposited or plated over one or more bond pads 216 associated with and electrically connected to each respective active component 206, 207, 208, wherein the metal distribution layer provides low electrical and thermal resistance to the respective active components. The one or more bond pads 216, for example, are deposited or plated over the protective overcoat 212, and are located directly and substantially vertically over the active components 206, 207, and 208 of the chip 200. As a consequence, the metal distribution layer 214 is integrated on the active surface 202 of the chip 200. The metal distribution layer 214, for example, generally extends a distance of approximately 6 μm to 25 μm from the active surface 202 of the chip 200.

In accordance with one exemplary aspect of the present invention, FIG. 6 illustrates the metal distribution layer 214, wherein the metal distribution layer further comprises one or more distribution lines or blocks 218 operable to provide thermal dissipation and power distribution for the respective active components 206a-206n and 207a-207n. The metal distribution layer 214 may further comprise one or more distribution pads 220 associated with active components 208, wherein while not necessarily required, the distribution pads may provide further enhanced thermal distribution and electrical conduction to the respective active components 208 (e.g., signal circuitry). For example, the one or more blocks 218 and one or more distribution pads 220 (e.g., plated copper) extend the thickness of the metal distribution layer 214 approximately an additional 30 μm to 100 μm over the active components 206, 207, and 208, such that the additional metal mass of the distribution blocks and pads provides an advantageous thermal distribution/heat dissipation function for the respective active components. According to another example, the metal distribution layer 214 also has a thermal conductance at least an order of magnitude greater than underlying thin film metal interconnects (such as interconnecting metal lines 210).

Accordingly, active components 206-208 below the metal distribution layer 214 are both thermally and electrically conductively connected to the metal distribution layer. In one example, the active components 206-208 are connected by metal-filled vias (not shown) that are in contact with metallization of the active components and with the metal distribution layer. The vias, for example, are formed by patterning and etching the overcoat 212, using standard photolithographic techniques. The vias may then be filled with metal in conjunction with a deposition of the metal distribution lines.

The patterned metal distribution layer 214, for example, is selected from a material that is solder bondable. Alternatively, a thin solder bondable layer (not shown) is formed over the metal distribution layer 214, such that the distribution lines 218 and distribution pads 220 may accept a solder bond thereto. The position of the patterned metal distribution layer 214 (e.g., the distribution lines 218) on the active surface 202 is selected to enhance dissipation of thermal energy released from the active components 206-208 below the metal distribution layer. Accordingly, the distribution lines or blocks 218 and/or pads 220 are positioned to steepen the temperature gradient for thermal flux from one or more selected active components 206-208 to the corresponding line and pad, thus advantageously providing a heat sink function for the respective active components.

Figure 7:
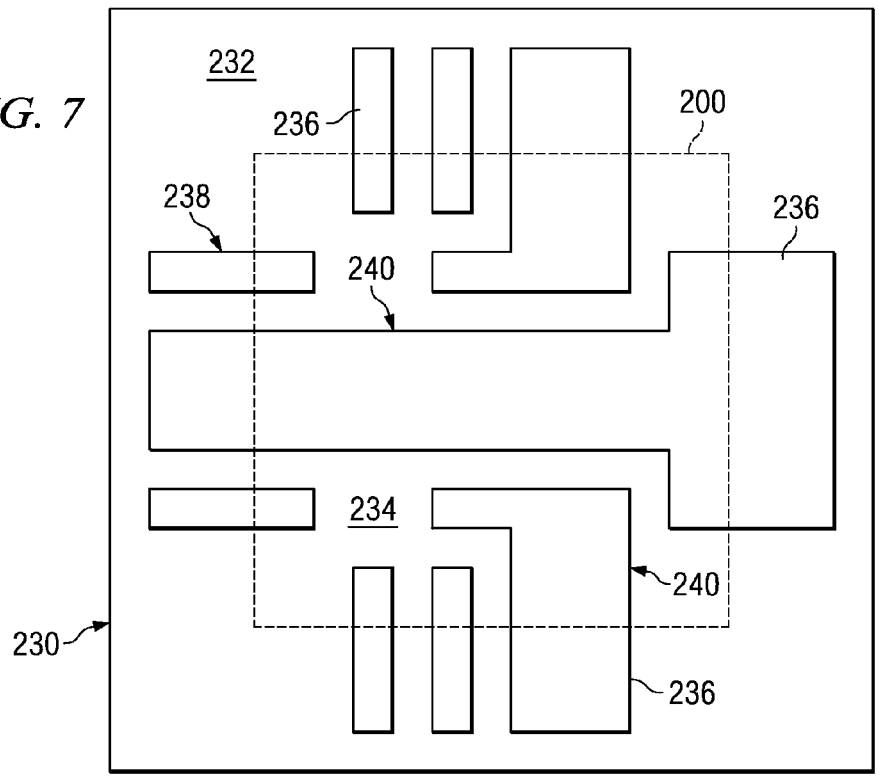
FIG. 7 is a plan view of a substrate according to one aspect of the present invention.

FIG. 7 illustrates another aspect of the present invention, where a substrate 230 is provided, wherein the semiconductor chip 200 of FIG. 6 is operable to be bonded to the substrate 230. The substrate 230, for example, comprises a printed circuit board (PCB), a metal leadframe, or any other substrate operable to carry the semiconductor chip and electrically connect thereto. The substrate 230 is generally defined by a perimeter region 232 and an interior region 234, wherein one or more metal lines 236 generally extend from one or more connection elements 238 disposed in the perimeter region to one or more high current contact pads 240 disposed in the interior region of the substrate. The one or more metal lines 236, one or more connection elements 238, and one or more high current contact pads 240, for example, may be formed from a common piece of metal, as in the case of a leadframe.

Alternatively, the one or more metal lines 236 (comprising the one or more connection elements 238 and one or more high current contact pads 240) may be patterned on a PCB, wherein a patterned or otherwise formed metal layer on the PCB comprises the one or more metal lines. It should be noted that the term "high current contact pad" is used to denote a high current-carrying capability, and/or a high thermal dissipation capability associated with the high current contact pad 240, and that either or both high power/current capacity and high thermal dissipation is provided by the high current contact pads. Such high current/high thermal dissipation capacities can be achieved by providing a surface area of the high current contact pad 240 that approximates a contact surface area of the metal distribution layer 214 of FIG. 6, as will be discussed hereafter.

Figure 8:
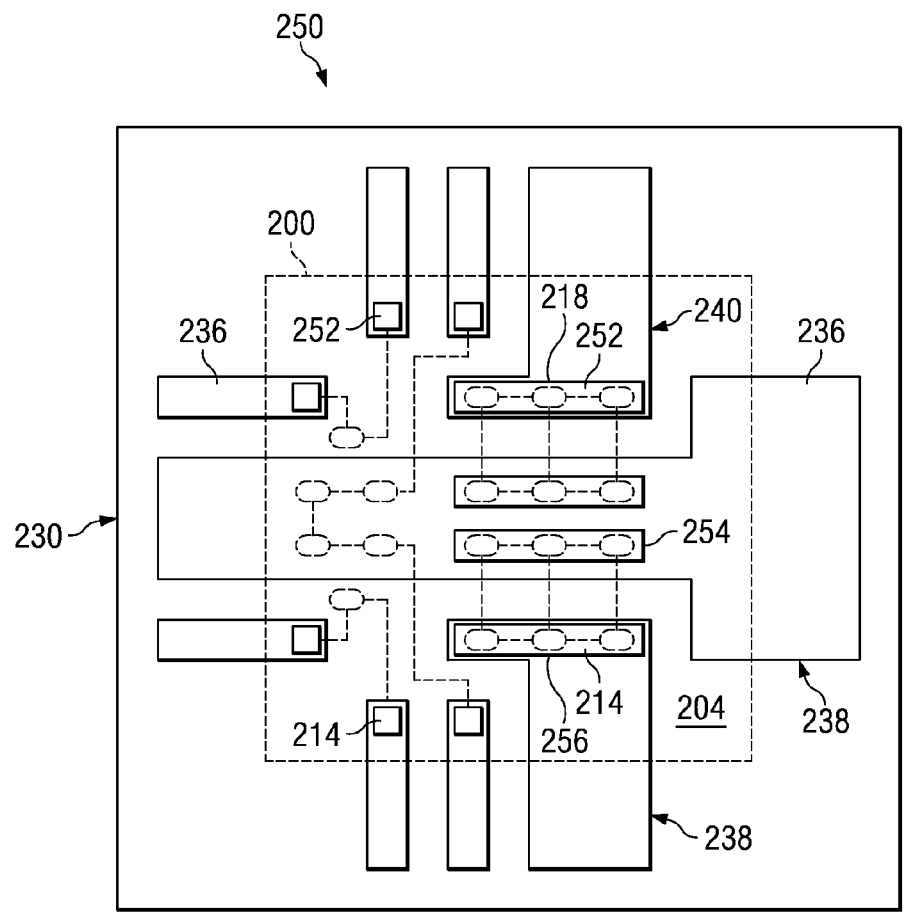
FIG. 8 is a plan view of a QFN integrated circuit package according to another aspect of the present invention.

In accordance with another aspect of the invention, FIG. 8 illustrates a simplified QFN integrated circuit package 250 comprising the chip 200 of FIG. 6 that is bonded to the substrate 230 of FIG. 7, wherein the chip is illustrated in phantom. As can be seen in FIG. 8, a solder connection 252 is disposed over the one or more metal lines 236 of the substrate 230, wherein the patterned metal distribution layer 214 of the chip 200 and the one or more metal lines are electrically and thermally connected to one another. In particular, the one or more high current contact pads 240 are electrically and thermally connected to the distribution lines or blocks 218 of FIG. 6, wherein a low thermal and electrical resistance path is provided between the high current contact pads and the patterned metal distribution layer 214. The metal distribution layer 214 patterned and thus integrated on the active surface 202 of the chip 200, for example, has a thermal conductance at least an order of magnitude greater than underlying thin film electrical interconnects prevalent in the chip. Accordingly, a low electrical and thermal resistance between the chip 200 and the substrate 230 of FIG. 8 is provided, wherein a high electrical conduction between the one or more connection elements 238 and the active components is further provided. The one or more connection elements 238 are then further operable to provide an electrical and/or thermal connection to external circuitry (not shown).

According to the present invention, the solder connection 252 of FIG. 8 comprises one or more strips of solder 254 that is applied to either the one or more high current pads 240 on the substrate 230 of FIG. 7, or the patterned metal distribution layer 214 on the chip 200 of FIG. 6. As opposed to conventional solder balls, the strips of solder 254 of FIG. 8, provide a generally uniform soldering surface 256 between the chip 200 and the substrate 230, wherein thermal, electrical, and mechanical uniformity between the chip and the substrate can be advantageously achieved. The solder connection 252, for example, is comprised of a metal of high thermal conductivity, and is applied to the one or more high current pads 240 or the patterned metal distribution layer 214 as a paste or preformed strip, and is reflowed in order to join the chip 200 to the substrate 230, such as by an application of infrared or radiant heat to the chip and substrate. The shape of the solder connection 252, for example, generally conforms to the shape of the respective high current pads 240 or the patterned metal distribution layer 214, wherein the shape of the solder connection remains generally constant between the time the solder connection is applied to the chip substrate 230 or chip 200 to the time it is reflowed, thus providing a high degree of uniformity and process efficiency. The solder connection 252, for example, is comprised of a paste or strip of pure tin, tin alloys including tin/copper, tin/indium, tin/silver, tin/bismuth, tin/lead, or other electrically and thermally conductive adhesive compounds.

Figure 9:
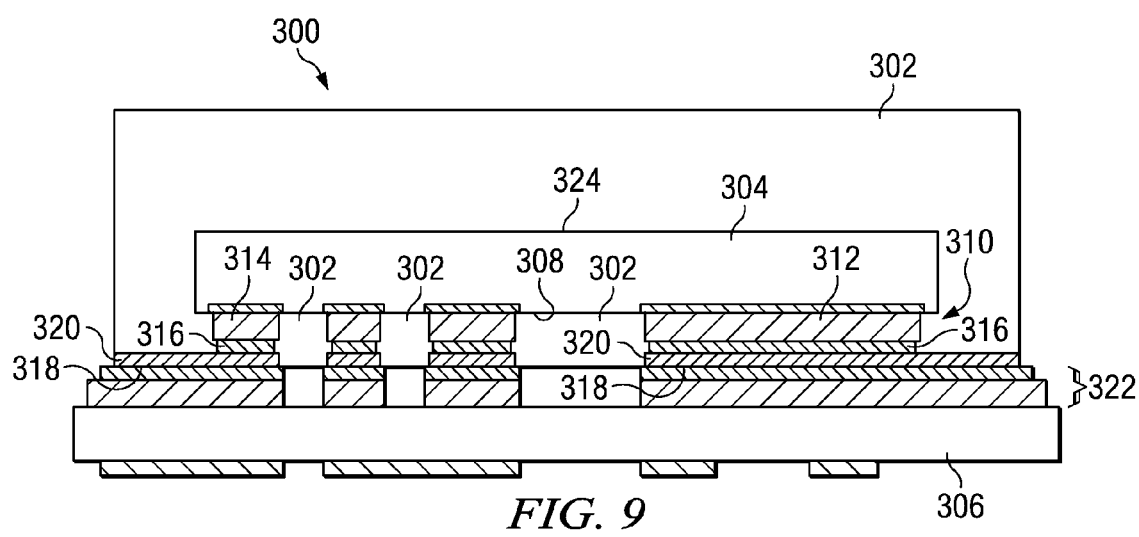
FIG. 9 is a cross-sectional view of a simplified QFN integrated circuit package mounted on a printed circuit board according to another aspect of the present invention.

In accordance with another aspect of the invention, another QFN integrated circuit package 300 is illustrated in cross-section in FIG. 9, wherein the QFN package further comprises an electrically insulative mold compound 302 that generally encapsulates another chip 304 that is coupled to a circuit board 306 in a manner similar to that discussed above. Again, it should be noted that the QFN package 300 is simplified for illustrative purposes, and should not be taken in a limiting sense.

As illustrated in FIG. 9, the active components or circuits (not shown) on an active surface 308 of the QFN package 300 are electrically and thermally connected to the circuit board substrate 306 via a patterned metal distribution layer 310 (e.g., comprising distribution blocks 312 and pads 314), solder connection 316, and metal lines 318 or lead frame, including a high current contact pad 320. The chip 304, for example, is generally encapsulated with the mold compound 302 prior to being coupled to the circuit board 306. Various other interconnect layers 322 are also shown, wherein the interconnect layers 322 may comprise various bond pads associated with the chip 304 or substrate 306, vias, or other bondable electrically and/or thermally conductive layers. Once the chip 304 is electrically and thermally coupled to the circuit board substrate 306 via the solder connection 316, for example, the chip is encapsulated with the mold compound 302, thus hermitically sealing the chip to the substrate and providing a QFN integrated circuit package 300 that protects the delicate chip from external environmental factors such as dust, humidity, and contact with various external objects.

As stated above, the position of the patterned metal distribution layer 310 (e.g., the distribution blocks 312 and pads 314) on the active surface 308 enhances dissipation of thermal energy released from the active components, wherein the distribution lines or blocks 314 and/or pads 314 advantageously act as a heat sink for the respective active components. However, in accordance with another aspect of the invention, should the desired removal of heat exceed the amount taken by the metal distribution layer 310, FIGS. 10-13 illustrate an additional integrated heat sink that is provided for further removal of thermal energy through a passive surface 324 of the chip 304.

Figure 10:
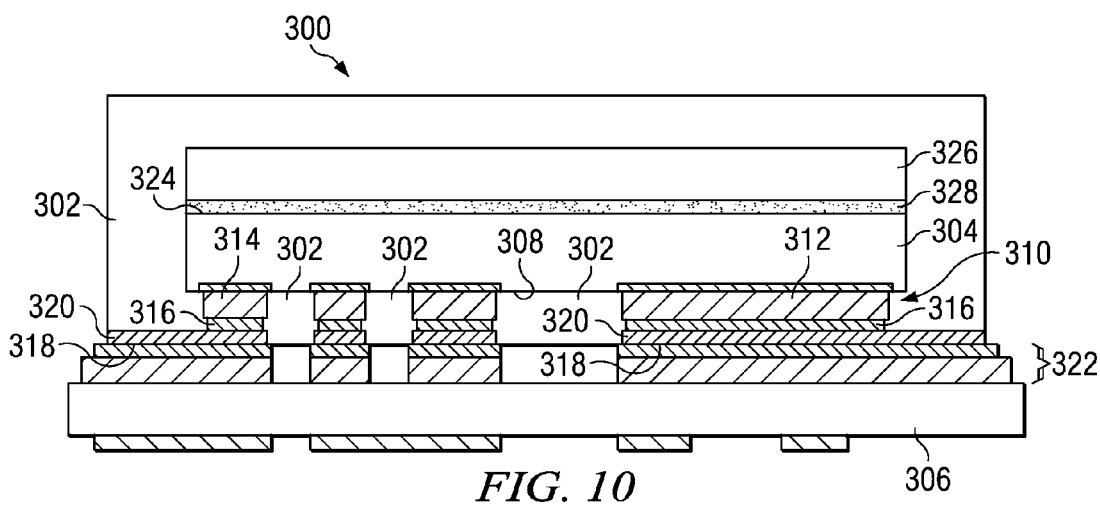
FIG. 10 is a cross-sectional view of another simplified QFN integrated circuit package mounted on a printed circuit board having an integrated heat sink.

For example, FIG. 10 illustrates the QFN package 300 comprising an integrated heat sink 326 that is thermally coupled to the passive surface 324 of the chip. A relatively thin stress-absorbing layer 328 is interposed between the integrated heat sink 326 and the passive surface 324 of the chip 304, wherein the stress-absorbing layer generally accounts for differences in thermal expansion between the integrated heat sink and the chip, while also providing acceptable thermal conduction between the heat sink and chip. For example, the stress-absorbing layer 328 is comprised of a refractory metal or paste which has a thickness large enough to reliably act as a stress-absorbing buffer between the chip 304 and the heat sink 326. As illustrated in FIG. 10, the integrated heat sink 326 is further generally encapsulated by the mold compound, wherein the integrated heat sink (e.g., a heat slug) is operable to provide additional thermal dissipation for the QFN package 300.

Figure 11:
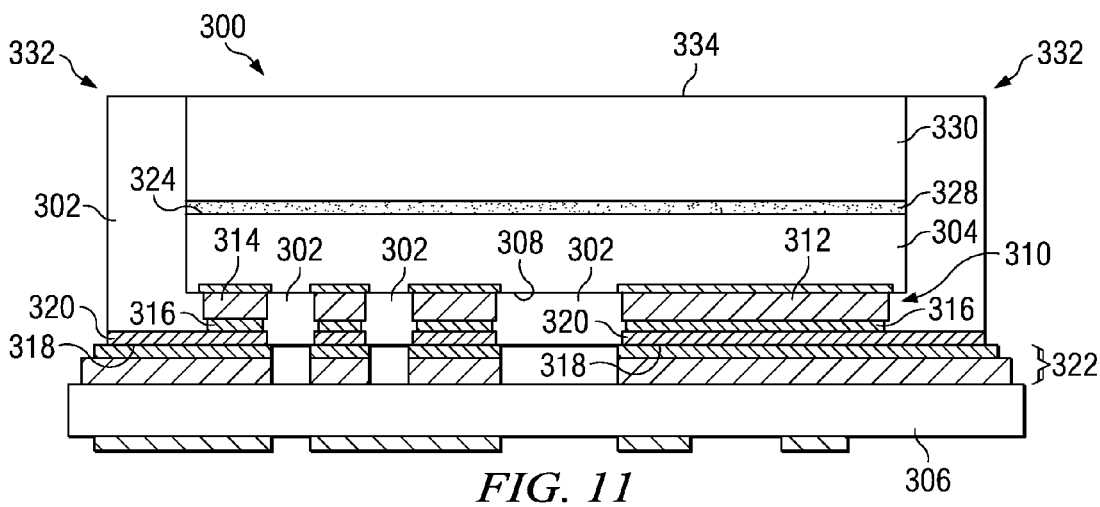
FIG. 11 is a cross-sectional view of a simplified QFN integrated circuit package mounted on a printed circuit board having an integrated heat sink having an exposed external surface.
Figure 12:
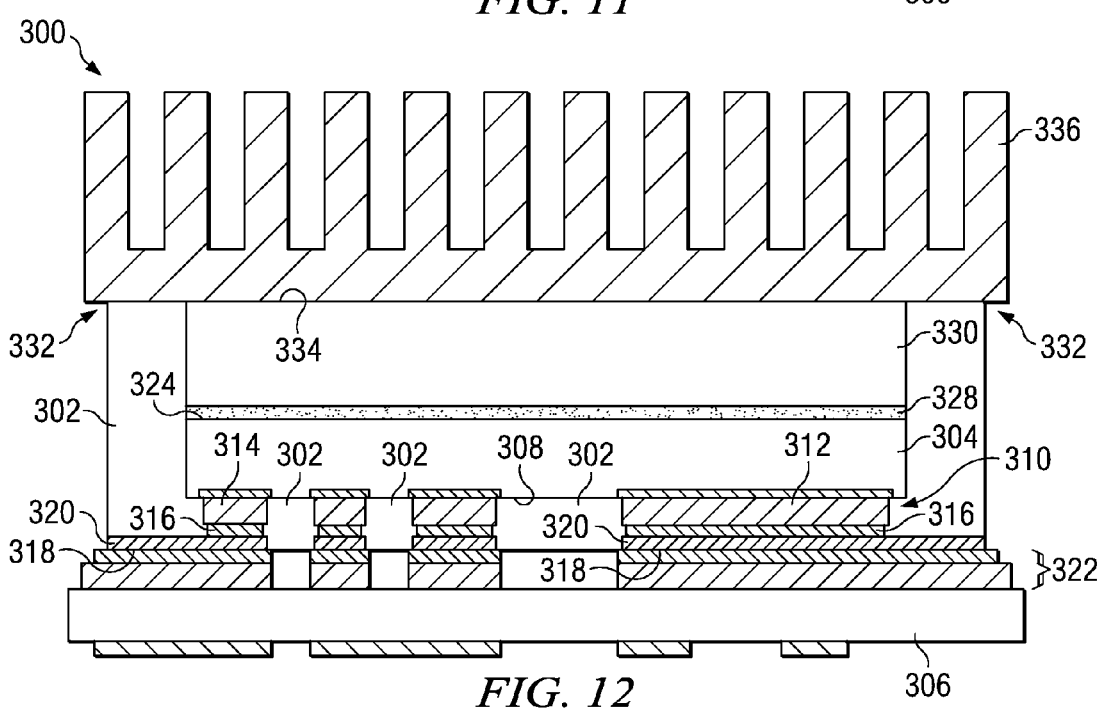
FIG. 12 is a cross-sectional view of a simplified QFN integrated circuit package mounted on a printed circuit board having an integrated heat sink and an external heat sink.

As illustrated in FIG. 11, another integrated heat sink 330 is illustrated, wherein a periphery 332 of the integrated heat sink is generally encapsulated by the mold compound 302, while an external surface 334 that is generally parallel to the passive surface 324 of the chip 304 remains exposed to the external environment and is not encapsulated by the mold compound. Thus, the integrated heat sink 330 provides an additional exposure of the thermal path from the active components and circuits through the passive surface 324 of the chip 304. In FIG. 12, an external heat sink 336 is thermally coupled to the external surface 334 of the integrated heat sink 330. The external heat sink 336, for example, can be further attached to the integrated heat sink 330 prior to encapsulation of the chip 304, wherein the chip is further environmentally protected.

Figure 13:
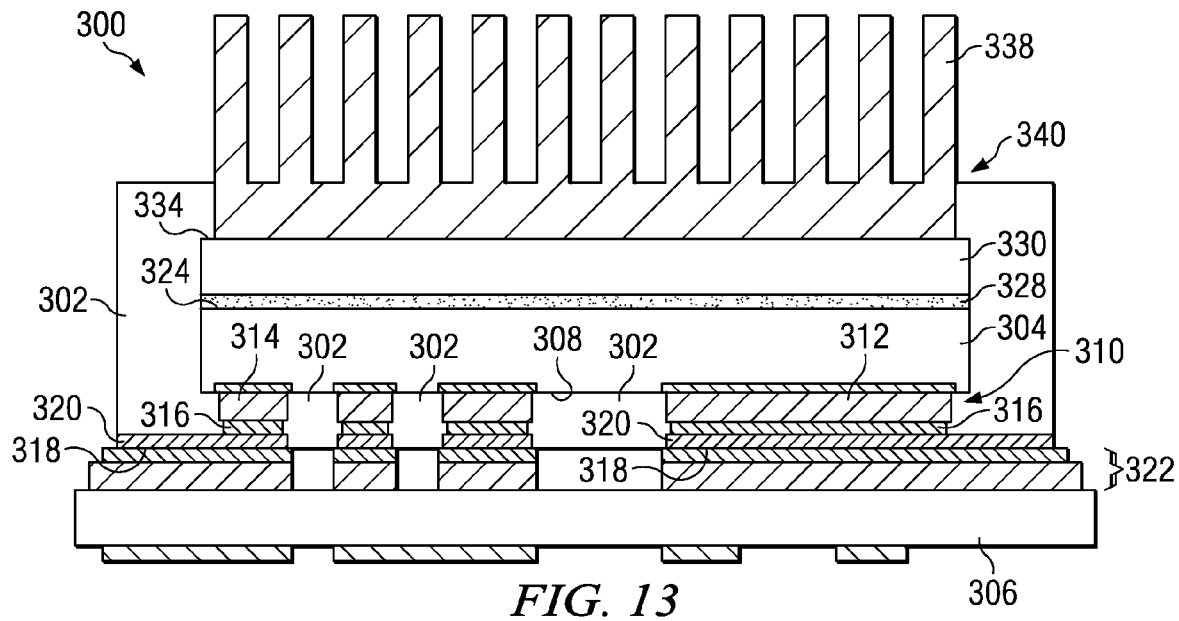
FIG. 13 is a cross-sectional view of another simplified QFN integrated circuit package mounted on a printed circuit board having an integrated heat sink having an over-molded external heat sink.

FIG. 13 illustrates yet another example of another external heat sink 338 that is thermally coupled to the integrated heat sink 330, wherein the external heat sink 338 is further overmolded and partially encapsulated by the mold compound 302 about its periphery 340. Thus, the external heat sink 338 is generally integrated with the QFN package 300 and provides a greater thermal transfer from the active components to the external environment. In one alternative, the finned external heat sink 338 may be coupled (via the stress-absorbing layer 328) directly to the passive surface 324 of the chip 304.

Figure 14:
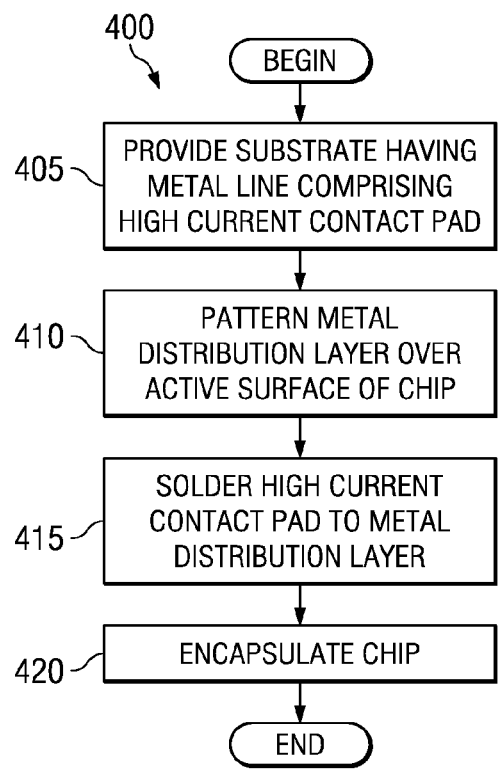
FIG. 14 is a block diagram schematic of a method for fabricating a QFN integrated circuit package in accordance with the present invention.

According to another aspect of the present invention, FIG. 14 is a block diagram illustrating a method 400 for fabricating a QFN integrated circuit package. While example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 14, the method 400 begins with act 405, wherein a substrate, such as a printed circuit board or leadframe, is provided. The substrate has a perimeter region an interior region, wherein a metal line extends between from the perimeter region to the interior region. The metal line, for example, comprises one or more connection elements disposed in the perimeter region and a high current contact pad disposed in the interior region of the substrate. In act 410, a metal distribution layer is patterned over an active surface of a semiconductor chip, wherein the active surface comprises one or more active components disposed thereon, and wherein the metal distribution layer electrically and thermally contacts the active component.

In act 415, the active surface of the semiconductor chip is placed generally facing the interior region of the substrate, and the high current contact pad is soldered to the patterned metal distribution layer, therein defining a solder connection providing a low thermal and electrical resistance path between the active component and the metal line of the substrate. Act 415, for example, may comprise applying a solder strip to one of the high current contact pad and the patterned metal distribution layer, and then placing the semiconductor chip over the substrate over the interior region of the substrate such that patterned metal distribution layer aligns with the high current contact pad. Once the patterned metal distribution layer aligns with and contacts the high current contact pad via the solder strip, thermal energy, such as infrared or radiant heat, is applied to the semiconductor chip and substrate, wherein the solder strip is generally reflowed or melted between the patterned metal distribution layer and the high current contact pad. The semiconductor chip and substrate are then allowed to cool, therein solidifying the reflowed or melted solder strip, and thus providing a generally rigid low thermal and electrical resistance path between the active component and the metal line of the substrate.

The solder strip, for example, may comprise a solder paste, wherein the solder paste is screen printed on the high current contact pad or the patterned metal distribution layer. The application of the solder strip may alternatively comprise a galvanic electroplating of solder on the high current contact pad(s) or patterned metal distribution layer. Alternatively, the application of a strip of solder may comprise any application of the solder strip such that the solder generally uniformly extends (with a generally uniform thickness) along a surface area of the respective high current contact pad(s) or patterned metal distribution layer.

The semiconductor chip and interior region of the substrate are further encapsulating with an electrically insulative mold compound in act 420, wherein the active surface of the chip is generally protected from the external environment via the mold compound. In accordance with one example, prior to encapsulating the chip in act 420, an integrated heat sink is placed over a passive surface of the semiconductor chip, wherein the passive surface is disposed generally opposite the active surface of the semiconductor chip. A stress relief material or stress-absorbing layer may also be applied to one or more of the passive surface of the semiconductor chip and the integrated heat sink prior to placing the integrated heat sink over the passive surface of the semiconductor chip, wherein the stress relief material generally relieves differences in thermal expansion between the integrated heat sink and the chip.

According to another example, an external surface of the integrated heat sink is masked prior to encapsulating the chip, wherein the external surface of the integrated heat sink is generally not encapsulated with the electrically insulative mold compound during act 420. An external heat sink may then be thermally coupled to the external surface of the integrated heat sink. Alternatively, the external heat sink may be thermally coupled to the external surface of the integrated heat sink prior to the encapsulation of act 420, a portion of the external heat sink is masked, thus encapsulating the chip and a periphery of the external heat sink during the encapsulation of act 420.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming an integrated circuit package, comprising:
    providing a semiconductor chip having active components connected to a metallic distribution block at the top of a first chip surface over a protective overcoat; the distribution block overlapping the active components, having a rectangular top surface portion;
    providing a substrate having a contact pad with a rectangular area portion greater than the distribution block; and
    soldering across the rectangular top surface portion of the distribution block with a solder material to the rectangular area of the contact pad on the substrate.

2. The method of claim 1, in which the solder material is a solder strip with an area similar to the distribution block.

3. The method of claim 1, in which the integrated circuit package is a QFN package.

4. The method of claim 1, in which the soldering step further including similarly soldering across a rectangular top surface portion of a second distribution block with a solder material to the rectangular area of the contact pad on the substrate.

5. The method of claim 4, in which the contact pad extends to a metal line.

6. The method of claim 5, in which the metal line extends to a perimeter region of the substrate.

* * * * *